Jan. 23, 1962 A. J. CORNISH ET AL 3,018,312
THERMOELECTRIC MATERIALS
Filed Aug. 4, 1959
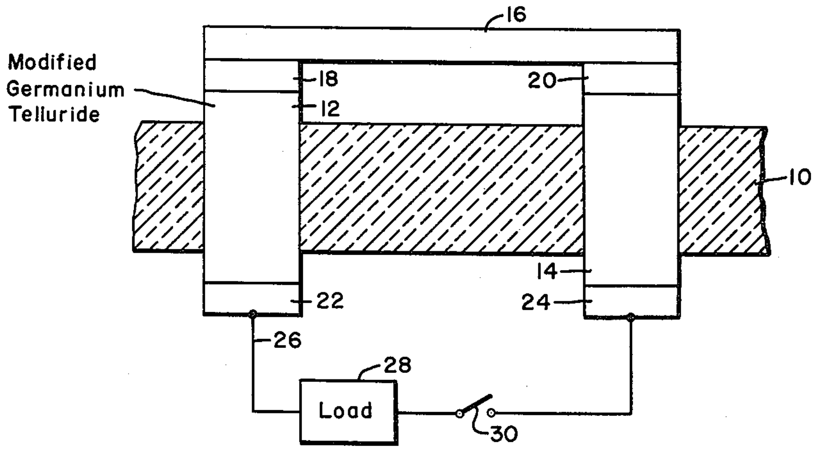
WITNESSES:
Bernard R. Gieguez
Charles L. Menzemer
INVENTORS
Albert J. Cornish and
Robert C. Miller.
BY
Frederick Shapoe
ATTORNEY 3,018,312

THERMOELECTRIC MATERIALS

Albert J. Cornish, Forest Hills Boro, and Robert C. Miller, Pittsburgh, Pa., assignors to Westinghouse Electric Corporation, East Pittsburgh, Pa., a corporation of Pennsylvania Filed Aug. 4, 1959, Ser. No. 831,504
6 Claims. (Cl. 136—5)

The present invention relates to thermoelements and thermoelectric devices embodying the same.

It has been regarded as highly desirable to produce thermoelectric devices wherein either an electric current is passed therethrough, whereby to provide for cooling application or alternately a source of heat is applied to one junction of thermoelectric devices to bring this junction to a given elevated temperature while the other junction is kept at a low temperature, whereby an electrical voltage is generated in the device. For refrigeration applications in particular, one junction of the thermoelectric device is disposed within an insulated chamber and electrical current is passed through the junction in such a direction that the junction within the chamber becomes cooler while the other junction of the thermoelectric device is disposed externally of the chamber and dissipates heat to a suitable heat sink such as the atmosphere, cooling water or the like.

When heat is applied to one junction of a thermoelectric device while the other junction is cooled, an electrical potential is produced proportional to the thermoelectric power of the thermoelements employed, and to the temperature difference between the junctions. Accordingly, it is desirable that the thermoelements be made of such material, that all other factors being equal, the highest potential is developed for the temperature difference between the hot and cold junctions. The electrical resistivity of the thermoelement member of the device and the thermal conductivity both should be as low as possible in order to reduce electrical losses and thermal losses.

Thermoelectric devices may be tested and a number indicating its relative effectiveness, called the figure of merit, may be computed from the test data. The higher the figure of merit, the more efficient is the thermoelectric design. The figure of merit, denoted as Z is defined by:

$$Z=\frac{\alpha^2}{pK}$$

wherein:

$\alpha$=thermoelectric power (volts/° C.)
$p$=electrical resistivity (ohm—cm.), and
$K$=thermal conductivity (watts/cm.° C.)

In some cases, another criterion often applied to describe the relative merit of a given thermoelectric material is the index of efficiency M. The higher the index of efficiency, the more efficient is the thermoelectric device in converting heat to electrical energy. The index of efficiency, denoted as M, for a thermoelement member may be defined as follows:

$$M=\frac{T\alpha^2}{4pK}$$

wherein T equals the absolute temperature and the other symbols have the meanings set forth above.

This invention is directed to the preparation of a homogeneous crystalline material having a formula:

$$Ge_{1-x}A_xTe_{1\text{ to }1.06}$$

wherein A is at least one element having more than two electrons available for bonding with tellurium, and $x$ varies from 0.001 to the limit of solubility thereof in germanium telluride, which may be as high as 0.15, which material is suitable for use as a thermoelectric member.

An object of the present invention is to provide a p-type thermoelectric member comprised of homogeneous crystalline material having a formula:

$$Ge_{1-x}A_xTe_{1\text{ to }1.06}$$

Another object of the present invention is to provide a thermoelectric device having one member comprised of a homogeneous crystalline material having a formula:

$$Ge_{1-x}Bi_xTe_{1\text{ to }1.06}$$

Other objects of the present invention will, in part, appear hereinafter and will, in part, be obvious.

For a better understanding of the nature and objects of the invention, reference should be had to the following detailed description and drawing, the single figure of which is a side view, partially in cross-section, of a thermoelectric generator.

In accordance with the present invention and attainment of the foregoing objects, there is provided a thermoelectric device comprising a first member comprised of a homogeneous crystalline compound having a formula:

$$Ge_{1-x}A_xTe_{1\text{ to }1.06}$$

wherein A is at least one element having more than two electrons available for bonding with tellurium, and $x$ varies from 0.001 to the limit of solubility of A within germanium telluride and which may be as high as 0.15, and a second member electrically connected to one portion of said first member. The A component of the compound $Ge_{1-x}A_xTe_{1\text{ to }1.06}$ which is at least one element having more than two electrons available for bonding with tellurium, is comprised of at least one element selected from the group consisting of bismuth, gallium, indium, iron, scandium, lanthanum, lead, yttrium, ruthenium and thallium. The compounds have been found to be p-type.

As set forth above, $x$ may vary from 0.001 to as much as 0.15. If the element or elements represented by A are present in quantities that exceeds their solubility in germanium telluride, the resultant compound will be a two-phase compound and will have inferior properties. In some cases the second phase, for example BiTe, has a low melting point so that it will be liquid at temperatures where the first phase or matrix is solid. If the element represented by A is present in an amount such that $x$ is equal to less than 0.001, little or no improvement will be realized over germanium telluride.

In a thermoelectric device, the aforesaid second member, which will be a negative thermoelectric element, may be comprised of a metal, for example, copper, silver and mixtures and alloys thereof, and negative thermoelectric materials, for example, indium arsenide, aluminum arsenide, antimony telluride, and mixtures thereof. Since a thermoelement comprising $Ge_{1-x}A_xTe_{1\text{ to }1.06}$ is most efficient at a temperature in the range of approximately 500° K. to 900° K., it will be understood that the negative thermoelement material also must function well and be chemically and thermally stable within this temperature range.

One method of preparing the crystalline material of this invention comprises admixing predetermined amounts of finely divided germanium, tellurium and at least one element selected from the group consisting of bismuth, gallium, indium, iron, scandium, lanthanum, lead, yttrium, ruthenium and thallium. The mixture is charged into a vessel of quartz or other inert material that will not react with the melt. The vessel is then evacuated and sealed off under a vacuum for example, a vacuum of approximately $10^{-4}$ mm. of mercury. The vessel is placed in a horizontal tube furnace and heated to a temperature in excess of 800° C. with agitation until the entire mixture becomes molten. The vessel is then suspended in the top zone of a vertical tube furnace having two heating zones. The top zone of the heating furnace is maintained at a temperature of at least 740° C., preferably about 800° C. The bottom zone of the furnace is maintained at a temperature below 710° C., preferably approximately 650° C. The vessel is slowly lowered through the top zone of the furnace to the bottom zone. Satisfactory results have been achieved when using a furnace having a top hot zone of 12 inches in length and a bottom cold zone of 12 inches in length when the vessel is lowered at a rate of approximately 2 inches per hour. After the vessel reaches the center of the bottom zone of the furnace, it is allowed to remain at a temperature of approximately 650° C. for several hours and then allowed to cool to room temperature. The solid crystalline body thus produced will have the formula $Ge_{1-x}A_xTe$ or with an excess of tellurium up to 6 mole percent, and is suitable for use as a p-type thermoelectric element.

The following examples are illustrative of the practice of this invention.

EXAMPLE I 6.534 grams of germanium, 2.090 grams of bismuth and 12.760 grams of tellurium were charged into a quartz bulb having an inside diameter of ⅝ inch. The bulb was evacuated and sealed off under a vacuum of $10^{-4}$ mm. of mercury. The bulb was placed in a furnace and heated to 800° C. at which temperature the mixture became molten. The bulb was agitated to insure mixing during the heating step, and then allowed to cool to room temperature (approximately 25° C.). The bulb was then suspended in the top zone of a vertical tube furnace having two heating zones. The top zone of the furnace was 12 inches long and the bottom heating zone was 12 inches long. The bulb was suspended at approximately the midpoint in the top heating zone of the furnace which was maintained at a temperature of 800° C., and the bulb was allowed to descend through the top zone at a rate of approximately 2 inches per hour. Upon descending from the top zone the bulb entered the lower heating zone which was maintained at a temperature of 650° C. The bulb was allowed to pass through approximately one-half (6 inches) of the lower heating zone and then stopped in its descent and maintained at a temperature of 650° C. for approximately 8 hours. The resultant crystalline compound had the formula:

$$Ge_{.9}Bi_{.1}Te$$

and was of a p-type semiconductivity.

The material prepared in accordance with the above example was cut into test wafers, and tested for its electrical and thermoelectric properties and the figure of merit was determined using the equation:

$$Z=\frac{\alpha^2}{pK}$$

The index of efficiency of the compound was determined using the equation:

$$M=\frac{T\alpha^2}{4pK}$$

wherein the various terms of the equation have the meanings set forth above.

The electrical and thermoelectric properties of the material were determined over a temperature range of between 500° K. and 800° K. and are set forth in the table below.

*Table*

| Material | T (° K.) | (watt) $k$ (cm., ° C.) | $p\cdot10^3$ (ohm-cm.) | (Micro-volts/° C.) | $Z\cdot10^3$ |
|---|---|---|---|---|---|
| $Ge_{0.9}Bi_{0.1}Te$ | 800 | .021 | 2.1 | 225 | 1.15 |
| $Ge_{0.9}Bi_{0.1}Te$ | 700 | .020 | 2.3 | 226 | 1.11 |
| $Ge_{0.9}Bi_{0.1}Te$ | 600 | .019 | 2.5 | 218 | 1.00 |
| $Ge_{0.9}Bi_{0.1}Te$ | 500 | .019 | 3.1 | 198 | 0.66 |

In other cases compositions were prepared similarly to Example I, but with a slight excess of Te. These materials, for example $Ge_{.9}Bi_{.1}Te_{1.01}$, were thermoelectrically p-type and highly effective in thermoelectric devices.

EXAMPLE II

The procedure of Example I was repeated using 6.534 grams of germanium, 0.697 gram of gallium and 12.760 grams of tellurium to produce a compound having the formula $Ge_{.9}Ga_{.1}Te$. The electrical properties of this compound were measured and found to be similar to those of $Ge_{.9}Bi_{.1}Te$ in the range of 500° K. to 900° K.

EXAMPLE III

The procedure of Example I was repeated using 6.171 grams of germanium, 1.721 grams of indium and 12.760 grams of tellurium. The compound produced had the formula $Ge_{.85}In_{.15}Te$ and will have satisfactory thermoelectric properties within the range of 500° K. to 900° K.

EXAMPLE IV

The procedure of Example I was repeated using 2.0058 grams germanium, 0.3122 gram ruthenium, and 3.9174 grams of tellurium. The compound produced had the formula $Ge_{.9}Ru_{.1}Te$ and will have satisfactory thermoelectric properties within the range of 500° K. to 900° K.

EXAMPLE V

The procedure of Example I was repeated using 6.7555 grams of germanium, 1.4363 grams of lanthanum, and 13.1937 grams of tellurium. The compound produced had the formula $Ge_{.9}La_{.1}Te$ and will exhibit satisfactory thermoelectric properties within the range of 500° K. to 900° K.

EXAMPLE VI

The procedure of Example I was repeated using 6.534 grams of germanium, 1.045 grams of bismuth, 0.577 gram of indium and 12.760 grams of tellurium. The compound produced had the formula $Ge_{.9}Bi_{.05}In_{.05}Te$ and will exhibit satisfactory thermoelectric properties within the range of 500° K. to 900° K.

Equally satisfactory thermoelectric materials will be realized following the procedure of Example I to produce compounds in which bismuth is replaced by iron, scandium, lead, yttrium, and thallium.

Referring to the figure of the drawing, there is illustrated a thermoelectric device suitable for producing electrical current from heat. The thermally insulating wall 10 so formed as to provide a suitable furnace chamber is perforated to permit the passage therethrough of a positive thermoelectric member 12 prepared in accordance with the teachings of this invention and a negative thermoelement member such as indium arsenide 14. An electrically conducting strip of metal, for example, copper, silver or the like, is joined to an end face 18 of the member 12 and end face 20 of the member 14 within the chamber so as to provide good electrical and thermal contact therewith. The end faces 18 and 20 may be coated with a thin layer of metal, for example, by vacuum evaporation or by use of ultrasonic brazing whereby good electrical contact is obtained. The metal strip 16 of copper, silver or the like may be brazed or soldered to the metal coated faces 18 and 20. The metal strip 16 may be provided with suitable fins or other means for conducting heat thereto from the furnace chamber in which it is disposed.

At the end of member 12 located on the other side of wall 10 is attached a metal plate or strip 22 by brazing or soldering in the same manner as was employed in attaching strip 16 to the end face 18. Similarly, a metal strip or plate 24 may be connected to the other end of member 14. The plates 22 and 24 may be provided with heat dissipating fins or other cooling means whereby heat conducted thereto may be dissipated. The surface of the plates 22 and 24 may also be cooled by passing a current of a fluid such as water across their surfaces. An electrical conductor 26 containing a load 28 is electrically connected to the end plates 22 and 24. A switch 30 is interposed in the conductor 26 to enable the electrical circuit to be opened and closed as desired. When the switch 30 is moved to the closed position, an electrical current flows between members 12 and 14 and energizes the load 28.

It will be appreciated that a plurality of pairs of the positive and negative members may be joined in series in order to produce a plurality of cooperating thermoelements. In a similar manner, each of the thermoelements will be disposed with one junction in a furnace or exposed to any other source of heat while the other junction is cooled by applying water or blowing air thereon or the like. Due to the relative difference in the temperature of the junctions, an electrical voltage will be generated in the thermoelements. By joining in series a plurality of the thermoelements, direct current at any suitable voltage will be generated.

A very satisfactory element would be one in which the A component would vary along the length of the element. For example, the high temperature (900° K.) end would be comprised of GeTe and the low temperature end (400 K.) would be comprised of $Ge_{.9}A_{.1}$ Te.

It will be appreciated that the above description and drawing is only exemplary and not exhaustive of the present invention.

We claim as our invention:

1. In a thermoelectric device a first member consisting of a homogeneous essentially single phase crystalline material having a formula $$Ge_{1-x}A_xTe_{1 \text{ to } 1.06}$$

wherein A is at least one element selected from the group consisting of bismuth, gallium, indium, iron, scandium, lanthanum, lead, yttrium, ruthenium and thallium and $x$ is at least 0.001 and not more than 0.15, and a second member electrically connected to one portion of said first member.

2. In a thermoelectric device a first member consisting of a homogeneous essentially single phase crystalline material having a formula $$Ge_{1-x}Bi_xTe_{1 \text{ to } 1.06}$$

wherein $x$ is at least 0.001 and not more than 0.15, and a second member electrically connected to one portion of said first member.

3. In a thermoelectric device a first member consisting of a homogeneous essentially single phase crystalline material having a nominal formula $$Ge_{.9}Bi_{.1}Te_{1 \text{ to } 1.06}$$

and a second member electrically connected to one portion of said first member.

4. A thermoelectric device capable of generating electrical power comprising a first member consisting of essentially a single phase crystalline homogeneous material having the formula $$Ge_{1-x}A_xTe_{1 \text{ to } 1.06}$$

wherein A is at least one element selected from the group consisting of bismuth, gallium, indium, iron, scandium, lanthanum, lead, yttrium, ruthenium and thallium and $x$ is at least 0.001 and not more than 0.15, a second member of a suitable negative thermoelement materail, an electrically conductive member disposed between and metallurgically joined to a first surface of said first member and a first surface of said second member, a heat source transmitting heat to the first surface of said first and said second member, an electrical conductor joining a second surface of said first member and a second surface of said second member, and means for cooling said second surface of said first and second members, whereby an electrical current is generated in the device.

5. A homogeneous essentially single phase crystalline material having a formula $$Ge_{1-x}A_xTe_{1 \text{ to } 1.06}$$

wherein A is at least one element selected from the group consisting of bismuth, gallium, indium, iron, scandium, lanthanum, lead, yttrium, ruthenium and thallium, and $x$ is at least 0.001 and not more than 0.15.

6. A homogeneous essentially single phase crystalline material having a formula $$Ge_{1-x}Bi_xTe_{1 \text{ to } 1.06}$$

wherein $x$ is at least 0.001 and not more than 0.15.

References Cited in the file of this patent

UNITED STATES PATENTS

| | | |
|---|---|---|
| 2,809,165 | Jenny | Oct. 8, 1957 |
| 2,944,975 | Folberth | July 12, 1960 |

OTHER REFERENCES

Nernst: "Theoretical Chemistry," pp. 21–22, 1895.